(12) United States Patent
Nistler et al.

(10) Patent No.: US 7,061,243 B2
(45) Date of Patent: Jun. 13, 2006

(54) TIME-VARYING MAGNETIC FIELDS GENERATOR FOR A MAGNETIC RESONANCE APPARATUS

(75) Inventors: Jürgen Nistler, Erlangen (DE); Stefan Stocker, Grossenseebach (DE); Markus Vester, Nürnberg (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/909,517

(22) Filed: Aug. 2, 2004

(65) Prior Publication Data
US 2005/0206381 A1    Sep. 22, 2005

(30) Foreign Application Priority Data
Aug. 5, 2003   (DE) .............................. 103 35 790

(51) Int. Cl.
*G01V 3/00* (2006.01)
(52) U.S. Cl. ........................... 324/318; 324/319
(58) Field of Classification Search ............ 324/318, 324/319, 322, 307, 309, 300; 600/410, 447
See application file for complete search history.

(56) References Cited

U.S. PATENT DOCUMENTS

| 4,680,548 | A |   | 7/1987 | Edelstein et al. |
| 4,926,125 | A | * | 5/1990 | Roemer ................. 324/318 |
| 5,367,261 | A | * | 11/1994 | Frederick ............... 324/318 |
| 5,424,643 | A | * | 6/1995 | Morich et al. .......... 324/318 |
| 6,711,430 | B1 | * | 3/2004 | Ferris et al. ............ 600/417 |

FOREIGN PATENT DOCUMENTS

| DE | 44 14 371 | 7/1995 |
| DE | 101 56 770 | 7/2002 |
| DE | 101 14 319 | 10/2002 |

* cited by examiner

*Primary Examiner*—Brij B. Shrivastav
(74) *Attorney, Agent, or Firm*—Schiff Hardin LLP

(57) ABSTRACT

A time-varying magnetic fields generator for a magnetic resonance apparatus has at least one gradient coil and one radio-frequency antenna, gradient coil being formed by two essentially hollow-cylindrical units that are axially separated from one another and that contain conductors of the gradient coil, and that each have at least one axial free space proceeding therethrough to accommodate a shim device, and at least one hollow conductor of the radio-frequency antenna is disposed between the units such that its hollow interior axially communicates with and continues at least one of the free spaces.

20 Claims, 3 Drawing Sheets

TIME-VARYING MAGNETIC FIELDS GENERATOR FOR A MAGNETIC RESONANCE APPARATUS

BACKGROUND OF THE INVENTION

1. Field of the Invention

The present invention concerns a time-varying magnetic fields generator for a magnetic resonance apparatus, and a magnetic resonance apparatus with such a generator.

2. Description of the Prior Art

Magnetic resonance is a known technology to acquire images of the inside of a body of an examination subject. In a magnetic resonance device, rapidly switched gradient fields that are generated by a gradient coil system are superimposed on a static homogenous basic magnetic field that is generated by a basic field magnet. The magnetic resonance device also has a radio-frequency system that radiates radio-frequency energy into the examination subject to excite magnetic resonance signals, and that acquires the generated magnetic resonance signals, on the basis of which magnetic resonance images are produced.

A magnetic resonance apparatus is known from German OS 44 14 371 in which a radio-frequency shield is disposed between a radio-frequency antenna and a gradient coil system, this radio-frequency shield being fashioned to be permeable for the electromagnetic fields generated in the low-frequency range by the gradient coil system and impermeable for the fields generated in the radio-frequency range by the radio-frequency antenna. The radio-frequency shield has a first electrically-conductive layer arrangement and (additionally) a second electrically-conductive layer arrangement disposed opposite the first, these electrically-conductive layer arrangements being separated from one another by a dielectric. Each layer arrangement has adjacent conductor runs that are separated from one another by electrically insulated slots; the slots in the first layer arrangement being displaced offset relative to those in the second layer arrangement. In at least one layer the adjacent conductor runs are connected with one another via specially arranged bridges (including, for example, capacitors) that conduct substantially only high-frequency currents.

The radio-frequency antenna of the magnetic resonance apparatus is, for example, fashioned in a form known as a birdcage antenna. A birdcage antenna, for generating a homogenous radio-frequency field within a volume enclosed by it, normally is fashioned such that longitudinal conductors that are connected with one another by ferrules (rings) disposed parallel to one another and equally separated to define a cylinder surface. Tuning ensues in the high-pass and low-pass filter ranges, by capacities introduced for each of the longitudinal conductor in the ferrules between adjacent conductors such that a homogenous radio-frequency field results at resonance. Embodiments of such a birdcage antenna are, for example, disclosed in U.S. Pat. No. 4,680,548.

A magnetic resonance apparatus is also known from German OS 101 14 319 in which an antenna conductor of a radio-frequency antenna of the magnetic resonance apparatus is designed to form a hollow space, and the hollow space is provided to accommodate a shim device of the magnetic resonance apparatus.

A magnetic resonance apparatus with a gradient coil system is known from German OS 101 56 770 in which an electrically-conductive structure is arranged and fashioned such that at least within in imaging volume of the magnetic resonance apparatus, a 3D field pattern of a magnetic field produced by a gradient field via induction effects is geometrically similar to the 3D field pattern of the gradient field. In an embodiment at least one part of the structure is barrel-stored as a component of a basic field magnet. Among other things, this gradient coil system can be advantageously fashioned without gradient shielding coils, because the unwanted consequences of the switched gradient fields can be nearly completely controlled by a pre-distortion due to the geometric similarity of the magnetic field caused by the structure, such that no diminution of the gradient fields occurs due to the gradient shielding coils.

SUMMARY OF THE INVENTION

An object of the present invention is to provide a time-varying magnetic fields generator for a magnetic resonance apparatus and a magnetic resonance apparatus with such a generator in which the generator can be fashioned compactly while still affording the possibility (capability) of accommodating a shim device.

This object is achieved by a time-varying magnetic fields for a magnetic resonance apparatus having at least one gradient coil and one radio-frequency antenna, wherein the gradient coil is formed by two essentially hollow-cylindrical units that are axially separated from one another, and contain conductors of the gradient coil, and that each have at least one axial free space proceeding therethrough to accommodate a shim device, and wherein at least one wave guide (hollow conductor) of the radio-frequency antenna is disposed between the units such that the hollow interior thereof communicates with and axially continues at least one of the free spaces.

Because the hollow interior of the hollow conductor of the radio-frequency antenna continues the free space, space advantages are used without disadvantageous interaction of the radio-frequency field of the radio-frequency antenna with the shim device.

In a preferred embodiment the hollow conductor is dimensioned such that the (large amplitude of the) RF field builds up an evanescent field inside the hollow conductor. In this case, even an open—not RF shielded—hollow conductor adds only little losses to the RF antenna. Therefore, it is advantageous to let some free space of the hollow inner of the conductor towards the RF field and not to slide the shim device through the hollow conductor until its end, because in the later case the evanescent wave still could create eddy currents in the shim elements.

The above object also is achieved in accordance with the invention by a magnetic resonance apparatus having such a generator.

DESCRIPTION OF THE PREFERRED EMBODIMENTS

Figure 1:
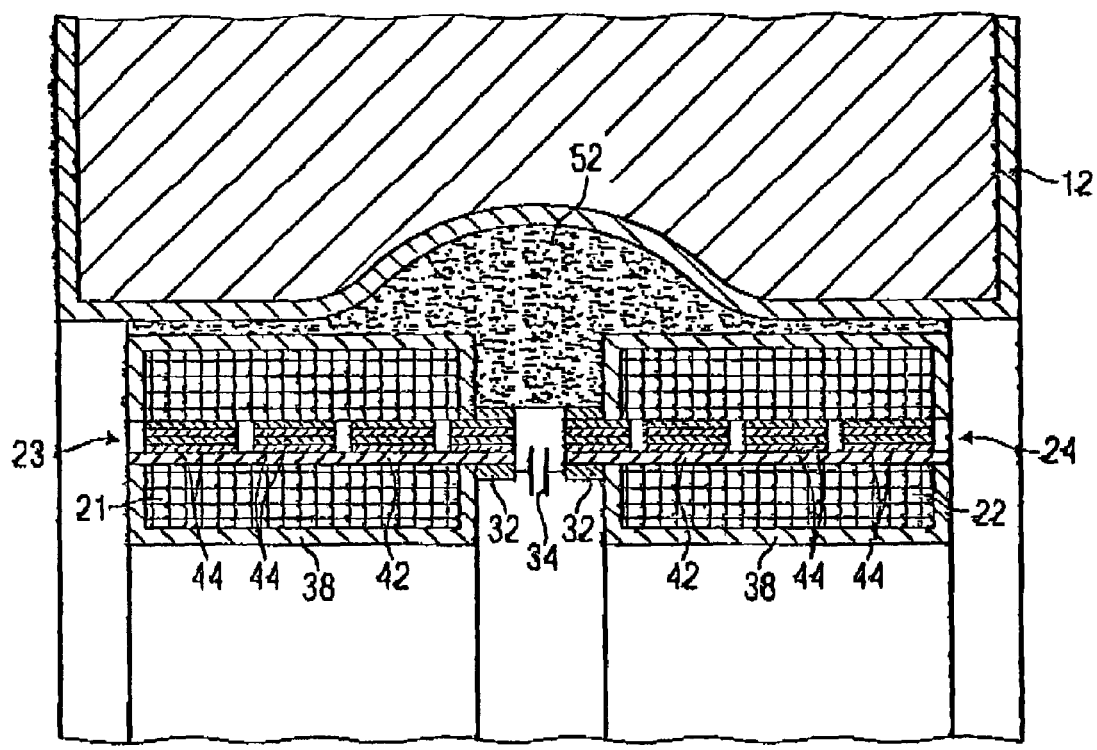
FIG. 1 is a longitudinal section through an upper half of a magnetic resonance apparatus in accordance with the invention, with a tunnel-like patient acceptance chamber, with a basic field magnet with a barrel-like bulge, and a gradient coil system formed by two halves, between which a radio-frequency antenna having a hollow conductor is disposed.

As an exemplary embodiment of the invention, FIG. 1 shows a longitudinal section through an upper half of an magnetic resonance apparatus with a tunnel-like patient acceptance chamber. To generate an optimally homogenous static basic magnetic field in the patient acceptance chamber, the magnetic resonance apparatus has an essentially hollow-cylindrical superconducting base field magnet, with an electrically-conductive vacuum reservoir 12 of the basic field magnet exhibiting a barrel-like bulge in the hollow interior to implement the concept of the previously mentioned German OS 101 56 770. A time-varying magnetic fields general or has a non-actively shielded gradient coil system and a radio-frequency antenna disposed in the hollow interior of the basic field magnet. The generator is connected to the basic field magnet by an intervening space filled with a mass 50 that exhibits low dielectric radio-frequency losses and that reinforces the overall arrangement to reduce mechanical vibrations and oscillations. Noise production is thus counteracted during operation of the magnetic resonance apparatus.

The gradient coil system has two hollow-cylindrical units 21 and 22 separated from one another that form first and second transversal gradient coils as well as a longitudinal gradient coil to generate rapidly switchable gradient fields. To accommodate a shim device, the halves 21 and 22 respectively contain free spaces 23 and 24 extending in the circumferential direction and passing through them in the axial direction. Furthermore, with the exception of the openings of the free spaces 23 and 24, each of the two units 21 and 22 is essentially enclosed by a radio-frequency shield 38.

Hollow conductors 32 of the radio-frequency disposed are arranged between the two units 21 and 22. The respective hollow interiors of the hollow conductors 32 thereby continue the free spaces 23 and 24 in the axial direction. The hollow conductors 32 are conductively connected with the radio-frequency shield 38 such that they conduct at radio frequencies. In approximately the center, the hollow conductors 32 exhibit a gap for a resonance capacitor 34 connected in-between to form a low-pass birdcage radio-frequency antenna. The shim device inserted into the free spaces 23 and 24 covers the location of the gap formed by with parts of the shim device. The shim device is formed by carrier devices 42 that carry elements 44 made of a magnetic material. Alternatively, the shim device can form an active shim.

Figure 2:
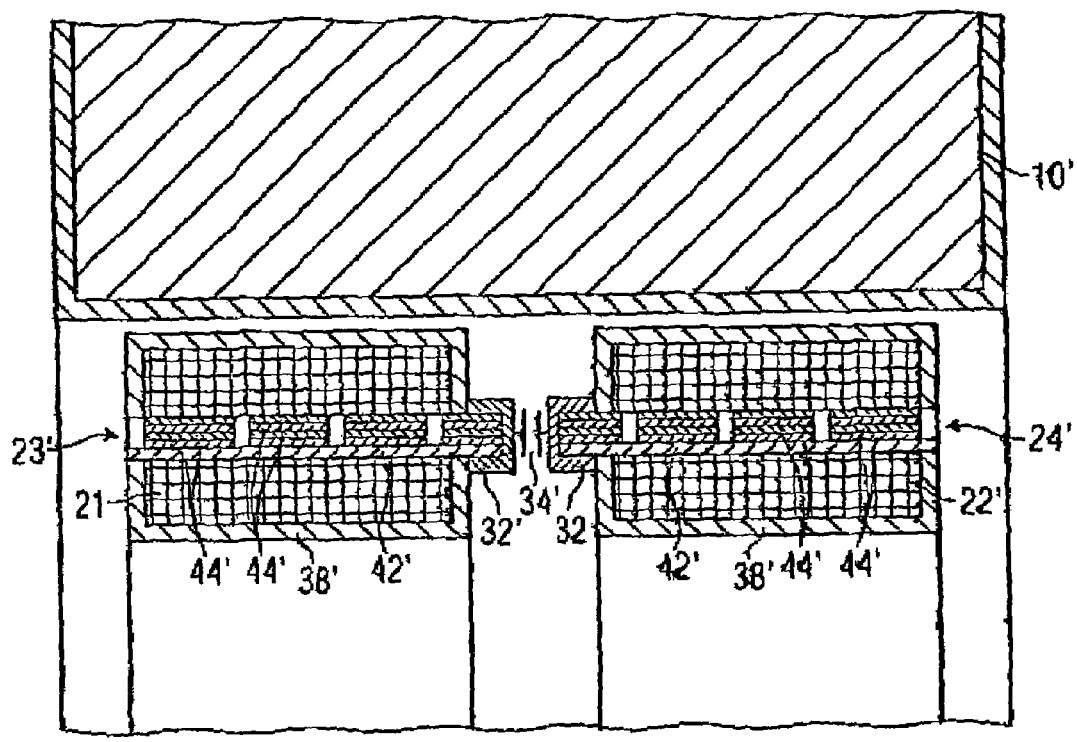
FIG. 2 is a longitudinal section through an upper half of a further embodiment of a magnetic resonance apparatus in accordance with the invention, with a hollow-cylindrical basic field magnet and a gradient coil system formed by two halves, between which a radio-frequency antenna comprising a hollow conductor is disposed.

As a further exemplary embodiment of the invention, FIG. 2 shows a longitudinal section through an upper half of an magnetic resonance apparatus with a tunnel-like patient acceptance chamber. To generate an optimally homogenous static basic magnetic field in the patient acceptance chamber, the magnetic resonance apparatus has an essentially hollow-cylindrical superconducting basic field magnet 10'. A time-varying magnetic fields generator having a gradient coil system and a radio-frequency antenna is arranged in the cylindrical hollow interior of the basic field magnet 10'.

The gradient coil system is formed by two hollow-cylindrical units 21' and 22' separated from one another that, to accommodate a shim device, have free spaces 23' and 24' extending in the circumferential direction and passing through them in the axial direction. Furthermore, with the exception of the openings of the free spaces 23' and 24', each of the two units 21' and 22' is essentially enclosed by a radio-frequency shield 38'.

Hollow conductors 32' of the radio-frequency antenna are disposed between the two units 21' and 22'. The hollow interiors of the hollow conductors 32' continue the free spaces 23' and 24' in the axial direction. The hollow conductors 32' are connected with the radio-frequency shield 38' such that they conduct at radio frequencies. In approximately the center, the hollow conductors 32' exhibit a gap for a resonance capacitor 34' connected in-between and are electrically-conductively closed on the front side facing the gap. The shim device inserted into the free spaces 23' and 24' covers the location of the gap with parts of the shim device. The shim device has carrier devices 42' that carry elements 44' made of a magnetic material.

Figure 3:
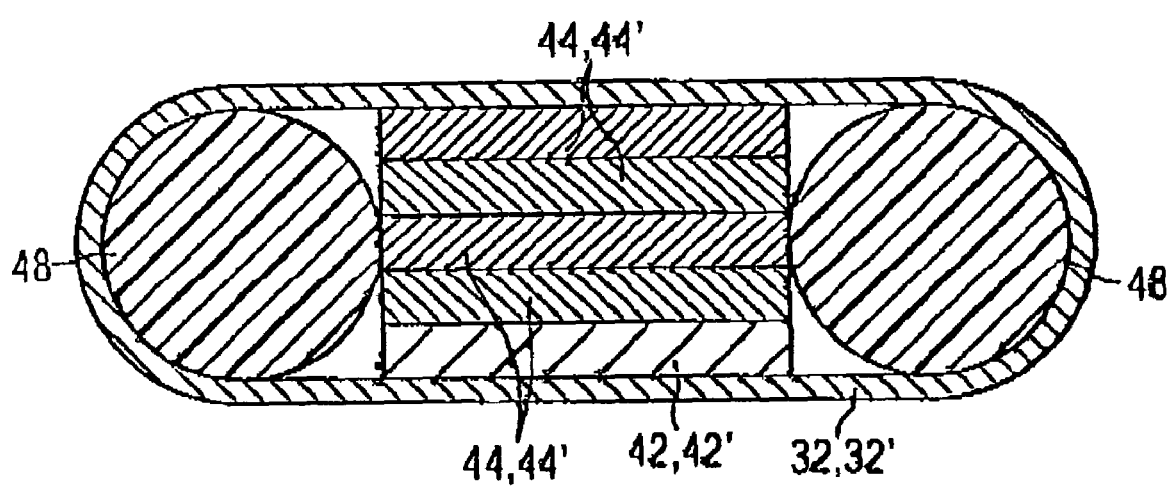
FIG. 3 is a cross-section through one of the hollow conductors of FIGS. 1 and 2, showing a passive shim device inserted into the hollow conductor and reinforcement device.

As a further exemplary embodiment of the invention, FIG. 3 shows a cross-section through one of the hollow conductors 32 and 32'. The hollow conductor 32, 32' is fashioned with an oval cross-section such that, in addition to a carrier device 42, 42' with shim elements 44, 44', two rods 48 made from fiberglass-reinforced plastic also can be inserted such that, among other things, the rigidity of the generator is substantially increased to suppress vibrations (and therewith noise) occurring in operation of the magnetic resonance apparatus.

Among other things, the subsequently published German OS 103 13 229 of the assignee is referenced for a more detailed description of the advantages (relative to conventional solutions) of a gradient coil system formed by two units 21 and 22 or 21' and 22', with a radio-frequency antenna arranged between them, and the distribution of conductors of gradient coils in both units 21 and 22, or 21' and 22'.

Although modifications and changes may be suggested by those skilled in the art, it is the intention of the inventors to embody within the patent warranted hereon all changes and modifications as reasonably and property come within the scope of their contribution to the art.

We claim as our invention:

1. A time-varying magnetic fields generator for a magnetic resonance apparatus comprising:
   at least one gradient coil formed by two substantially hollow-cylindrical units that are axially separated from each other, said units containing conductors for said gradient coil, each of said units having an axial free space therein adapted to receive a shim device; and
   a radio frequency antenna having at least one conductor forming a tubular configuration disposed between said units, said configuration having a hollow interior axially communicating with and continuing the axial free space of at least one of said units.

2. A generator as claimed in claim 1 comprising a first hollow conductor disposed at a first of said units and a second hollow conductor disposed at a second of said units, said first and second hollow conductors being disposed with a gap therebetween.

3. A generator as claimed in claim 2 wherein said units are separated from each other by a region having a center, and wherein said gap is disposed at said center of said region.

4. A generator as claimed in claim 2 comprising a capacitor bridging said gap.

5. A generator as claimed in claim 2 wherein each of said first and second hollow conductors is closed at a side thereof facing said gap.

6. A generator as claimed in claim 1 comprising a first radio frequency shield enclosing a first of said units and a second radio frequency shield enclosing a second of said units.

7. A generator as claimed in claim 6 wherein said radio frequency shield covers an opening of said free space.

8. A generator as claimed in claim 7 wherein said hollow conductor is connected to said radio frequency shield for conducting at radio frequencies.

9. A generator as claimed in claim 6 wherein said gradient coil emits a gradient field and wherein said radio frequency antenna emits a radio frequency field, and wherein said radio frequency shield is permeable to said gradient field and substantially impermeable to said radio frequency field.

10. A generator as claimed in claim 1 wherein said radio antenna is a birdcage antenna.

11. A generator as claimed in claim 1 comprising a shim device disposed in said free space comprising a carrier carrying a plurality of passive shim elements.

12. A generator as claimed in claim 1 comprising a reinforcement device disposed in said free spaced.

13. A generator as claimed in claim 12 wherein said reinforcement device comprises a rod.

14. A generator as claimed in claim 13 wherein said rod is comprised of fiber-reinforced plastic.

15. A magnetic resonance apparatus comprising:
   a basic field magnet having a hollow interior opening proceeding therethrough; and
   a time-varying fields generator disposed in said opening of said basic field magnet, said generator comprising at least one gradient coil formed by two substantially hollow-cylindrical units that are axially separated from each other, said units containing conductors for said gradient coil, each of said units having an axial free space therein adapted to receive a shim device, and a radio frequency antenna having at least one conductor forming a tubular configuration, said configuration disposed between said units, said configuration having a hollow interior axially communicating with and continuing the free space of at least one of said units.

16. A magnetic resonance apparatus as claimed in claim 15 wherein said basic field magnet generates a static, homogenous basic magnetic field in an imaging volume, and wherein said gradient coil generates a time-varying gradient field, and wherein said magnetic resonance apparatus comprises an electrically conductive structure at least partially surrounding said gradient coil wherein an eddy current is produced by said time-varying gradient field, said eddy current having an eddy current field associated therewith in said imaging volume.

17. A magnetic resonance apparatus as claimed in claim 16 wherein said gradient coil and said structure are respectively configured for causing said eddy current field in said imaging volume to be geometrically similar to said gradient field.

18. A magnetic resonance apparatus as claimed in claim 17 wherein said electrically conductive structure has a barrel-like shape.

19. A magnetic resonance apparatus as claimed in claim 16 wherein said electrically conductive structure is a part of said basic field magnet.

20. A magnetic resonance apparatus as claimed in claim 19 wherein said basic field magnetic is a superconducting magnet having a vacuum reservoir forming said electrically conductive structure.

\* \* \* \* \*